United States Patent
Katayama et al.

(10) Patent No.: US 6,217,265 B1
(45) Date of Patent: Apr. 17, 2001

(54) PRINTED CIRCUIT BOARD DRILLING MACHINE AND ITS MAINTENANCE METHOD

(75) Inventors: Atsushi Katayama, Kodaira; Kenta Kumagai, Suginami-ku; Norio Michigami, Zama; Katsuhiro Nagasawa, Yamato, all of (JP)

(73) Assignee: Hitachi via Mechanics, Ltd., Kanagawa-ken (JP)

( * ) Notice: Subject to any disclaimer, the term of this patent is extended or adjusted under 35 U.S.C. 154(b) by 0 days.

(21) Appl. No.: 09/322,995

(22) Filed: Jun. 1, 1999

(30) Foreign Application Priority Data

Jun. 2, 1998 (JP) .................................................. 10-152996

(51) Int. Cl.[7] ............................. B23B 35/00; B23Q 11/08
(52) U.S. Cl. ............................ 408/1 R; 74/608; 100/349; 83/546; 408/234; 408/241 G; 409/134; 409/235
(58) Field of Search ................................. 408/1 R, 3, 42, 408/234, 241 G; 409/134, 235; 74/608; 100/349; 83/544–546; 144/251.1, 252.1

(56) References Cited

U.S. PATENT DOCUMENTS

| | | | |
|---|---|---|---|
| 1,794,469 | * 3/1931 | McIntyre | 83/546 |
| 4,842,455 | * 6/1989 | Winkler et al. | 409/134 |
| 4,863,320 | * 9/1989 | Rutschle et al. | 409/134 |
| 4,911,589 | * 3/1990 | Winkler et al. | 408/234 |
| 5,678,291 | * 10/1997 | Braun | 408/234 |

* cited by examiner

Primary Examiner—Steven C. Bishop
(74) Attorney, Agent, or Firm—Mattingly, Stanger & Malur

(57) ABSTRACT

A printed circuit board drilling machine, with a well-designed outer shape, providing excellent operability and maintainability, which sequentially makes a number of holes in at least one printed circuit board, placed on a table 22 moved in an XY plane, by using a drill driven by a spindle motor 27. The machine has openable/closable doors 20 and 21 which is separated into an upper door and a lower door in a front portion. The upper door 20 opens upward, while the lower door 21 opens downward. The upper door 20 comprises transparent material. Upon maintenance, the doors 20 and 21 are opened, and the table 22 is moved inwardly. Thus, the distance from the outside of the machine to the spindle motor 27 and its peripheral parts can be reduced, and maintenance can be easily performed with respect to the spindle motor 27 and its peripheral parts.

4 Claims, 2 Drawing Sheets

PRINTED CIRCUIT BOARD DRILLING MACHINE AND ITS MAINTENANCE METHOD

BACKGROUND OF THE INVENTION

The present invention relates to a printed circuit board drilling machine and its maintenance method, and more particularly, to a printed circuit board drilling machine having a structure providing excellent operability and maintainability and a maintenance method for the printed circuit board drilling machine.

Printed circuit board drilling machines in accordance with conventional techniques are large sized devices generally comprising, as principal constituents, a plurality of spindle motors respectively holding a drill and moving the drill upward/downward, and a table, carrying a plurality of printed circuit boards, moving in at least an X-direction. In use of such conventional printed circuit board drilling machine, it is necessary to perform maintenance work on the spindle motors and peripheral parts very frequently. Further, to prevent the risk of injury when the machine is in action, the entire machine is contained in a cover formed along the outer shape of the machine.

As the above-described conventional printed circuit board drilling machine is a large sized device, an operator cannot reach the positions of the spindle motors unless the operator stretches himself/herself over the table holding the printed circuit board. Thus, the maintenance work on the spindle motors and peripheral parts requires a lot of labor, further, forces the operator to work in an unnatural posture.

SUMMARY OF THE INVENTION

Accordingly, an object of the present invention is to provide a printed circuit board drilling machine which solves the drawbacks of the above-described conventional art and provides excellent operability and maintainability, and a maintenance method appropriate to the machine.

According to the present invention, the foregoing object is attained by providing a printed circuit board drilling machine which sequentially makes a number of holes in at least one printed circuit board, placed on a table moved in at least an X-direction, by using a drill driven by a spindle motor, wherein an openable/closable door is provided in a front portion, wherein the door being separated into an upper door and a lower door, and wherein the upper door opens upward, while the lower door opens downward.

Further, the foregoing object is attained by providing a printed circuit board drilling machine having the above construction, wherein a junction portion between the upper door and the lower door is projected to a position in front of a front surface of a base portion of the lower portion of the machine, further, the lower door covers at least a guide device having a table driving mechanism below the table.

Further, the foregoing object is attained by providing a maintenance method for a printed circuit board drilling machine which sequentially makes a number of holes in at least one printed circuit board, placed on a table moved in at least an X-direction, by using a drill driven by a spindle motor, comprising the steps of: opening a door, separated into an upper door and a lower door, provided in a front portion of the machine such that the upper door opens upward and the lower door opens downward; and moving the table inwardly for maintenance with respect to inside of the drilling machine.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Hereinbelow, a printed circuit board drilling machine and its maintenance method will be described in detail in accordance with the accompanying drawings.

Figure 1:
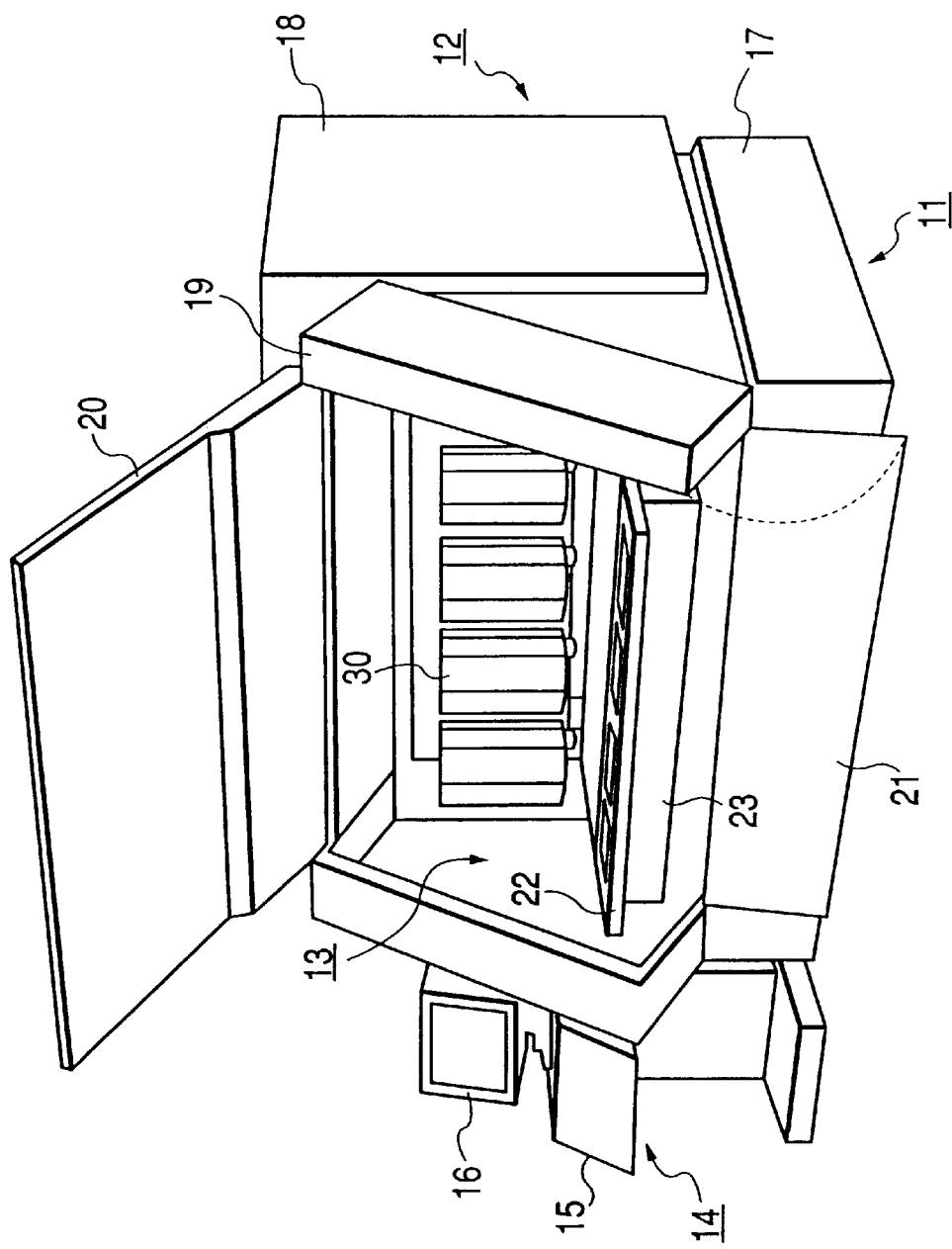
FIG. 1 is a perspective view explaining the overall structure of a printed circuit board drilling machine as an embodiment of the present invention.
Figure 2:
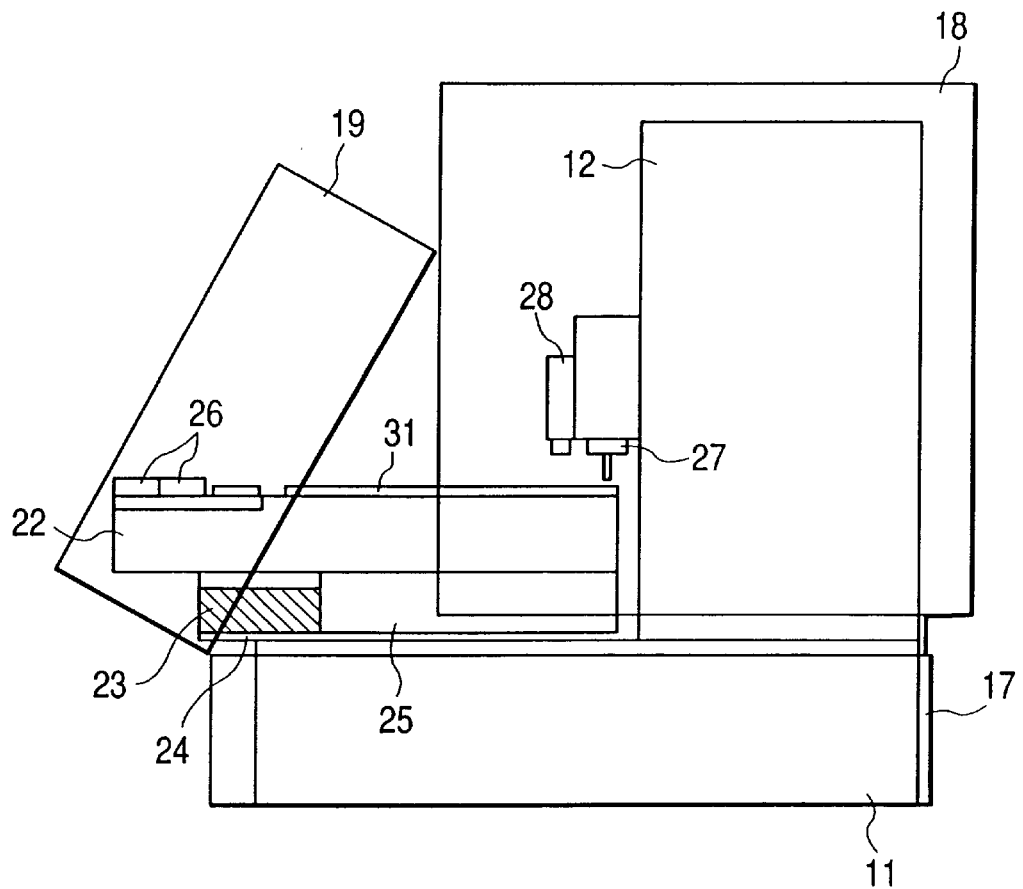
FIG. 2 is a cross sectional view of the printed circuit board drilling machine in FIG. 1.
Figure 3:
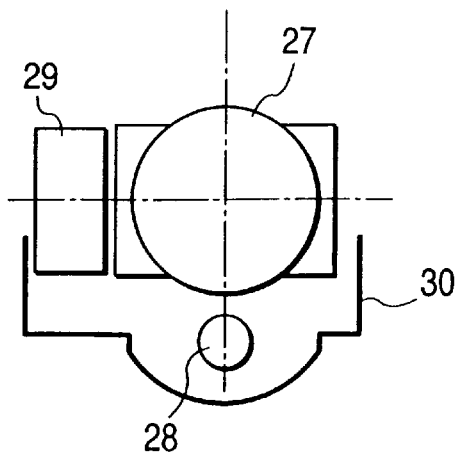
FIG. 3 is a top plan view of peripheral parts of a spindle motor of the printed circuit board drilling machine in FIG. 2.

FIG. 1 shows the entire structure of the printed circuit board drilling machine according to an embodiment of the present invention. FIG. 2 shows a side view of the structure of the printed circuit board drilling machine in FIG. 1. FIG. 3 shows the arrangement of peripheral parts of a spindle motor in FIG. 2.

In FIGS. 1 to 3, reference numeral 11 denotes a bed; 12, a main frame; 13, a front portion; 14, a control device; 15, an operation unit; 16, a display unit; 17, a bed cover; 18, a main frame cover; 19, a front cover; 20, an upper door; 21, a lower door; 22, a table; 23, a bellows support; 24, a bellows; 25, a guide device; 26, tool cassette(s); 27, spindle motor(s); 28, tool transfer chuck(s); 29, sensor box(es); 30, spindle cover(s); and 31, printed circuit board(s).

As shown in FIGS. 1 and 2, the printed circuit board drilling machine according to the present embodiment comprises the bed 11 covered with the bed cover 17, the main frame 12 covered with the main frame cover 18, and the front portion 13 covered with the front cover 19, the upper door 20 and the lower door 21.

The bed 11 includes a drive source which drives the table 22, on which the printed circuit board 31 to be processed is mounted, in at least an X-direction of an XY plane, and the like. The main frame 12 includes mechanical parts such as air compressor units as drive sources of the spindle motors 27 and chip suction units. The front portion 13, which allows the operator to access the machine for change of printed circuit board and the like, does not have any particular unit, but it simply covers operating units such as the table 22 and the spindle motors 27.

A guide device 25, placed on the bed 11, guides the table 22 in forward and backward directions (rightward and leftward directions in FIG. 2). The bellows 24 is provided between the bellows support 23 and a lower part of the table 22 such that the bellows 24 covers a moving surface exposed with movement of the table 22.

The tool cassettes 26 holding a number of replacement drills and the like are provided on a front side of the table 22, while a plural number of printed circuit boards 31 to be processed are placed on an inner side of the table 22. The table 22 is moved in at least the X-direction of the XY plane as a horizontal plane such that the distal end of a drill, driven by each spindle motor 27, is positioned in a drilling position of each printed circuit board 31.

As described above, the main frame 12 includes mechanical parts such as air compressor units as drive sources of the spindle motors 27 and chip suction units. A plurality of spindle motors 27, i.e., four spindle motors 27 for the four printed circuit boards 31 in FIG. 1, are attached to the main frame 12 such that the spindle motors can be moved in upward and downward directions. Tool transfer chucks 28, used for transferring drills to be attached to the spindle motors 27 between the tool cassettes 26 and the spindle motors 27, are attached to the respective spindle motors 27.

As shown in FIG. 3, a sensor box 29 for positioning the drill in the upward and downward directions is provided by the side of each spindle motor 27. Further, though not shown in FIG. 3, a number of parts such as various wirings for control from a higher unit and a chip suction pipe are provided around the spindle motor 27, and the spindle cover 30 is provided so as to cover the parts. Note that the lower end of the spindle cover 30 is positioned at a height to expose a drill chuck attached to the lower end of the spindle motor 27. By this arrangement, the drill can be exchanged for another drill upon maintenance without removing the spindle cover 30.

The front portion 13 has the upper door 20 of transparent material and the lower door 21 such that the operator can access the machine for exchange of printed circuit boards and the like, and can monitor the operation status of the machine from outside. The surface of the upper door 20 is tilted with respect to the main frame 12 and the bed 11 so as to receive the operator's line of sight at an approximately right angle. Further, in the front portion 13, the front cover 19 has a rectangular side surface with a length longer than a width as shown in FIG. 2, and the front cover 19 is connected to the bed 11 and the main frame 12 such that one corner of the side surface of the front cover 19 is positioned in front of the front surface of the bed 11, so as to cover the table 22 which can move from the front surface of the bed 11 frontward.

The upper door 20 opens upward from the above-described corner of the front cover 19 in front of the front surface of the bed 11. The lower door 21 opens downward from the above-described corner of the front cover 19.

It may be arranged such that a plural number of printed circuit board drilling machines each having the above construction are arrayed in parallel, and the machines operate simultaneously. To control one or plural drilling machines, the operation unit 15, the display unit 16 comprising a CRT, a liquid crystal display device or the like, and the control device 14 having a controller (not shown) comprising a CPU, memory and the like, are provided. Although not shown in the figures, keys for start and stop operations, operation display lamps, fault display lamps and the like for the respective printed circuit board drilling machines may be provided on the front surface of the front cover 19.

Next, the outline of drilling operation by the printed circuit board drilling machine having the above construction with respect to the printed circuit board will be described.

The control device 14 holds drilling position information with respect to circuit boards to be processed, board thickness information and the like stored therein in advance. The operator opens the upper door provided in the front cover 19, and sets the printed circuit boards 31 to be processed on the table 22 of the drilling machine.

In response to an operation start instruction, the control device 14 sequentially generates control signals to drive the table 22 based on the drilling position information with respect to the printed circuit boards to be processed, and sends the signals to the printed circuit board drilling machine. The printed circuit board drilling machine controls the movement of the table 22 based on the drilling position information, to set the drilling positions of the printed circuit boards immediately below the drills attached to the plurality of spindle motors 27, and moves the spindle motors 27 downward to make holes in the designated positions of the printed circuit boards.

The printed circuit board drilling machine can make several hundreds to several thousands holes in one printed circuit board by repeating the above-described operation. In the present embodiment, one drilling machine has four spindle motors 27, therefore, it can make holes in the same position of four printed circuit boards. Further, drilling can be performed on more printed circuit boards by using plural drilling machines simultaneously.

Next, a maintenance method for the printed circuit board drilling machine having the above construction will be described.

Generally, maintenance of the printed circuit board drilling machine is performed on peripheral parts of the spindle motor 27. For this purpose, the maintenance person first opens the upper and lower doors 20 and 21 provided in the front cover 19. In the present embodiment, as a front door portion is separated as the upper and lower doors, the upper door 20 can be sprung upward with a comparatively small amount of force. Further, in a state where the upper door 20 is completely open, the maintenance person average 1650 mm in height can hold the end of the upper door 20. Further, the lower door 21 opens downward, therefore, it overlaps with the front surface of the bed cover 17.

Thereafter, the maintenance person moves the table 22 inwardly to a position where its front end corresponds with the position of the front surface of the bed cover 17, i.e., the position of the lower door 21 in open state. As a result, the maintenance person can perform maintenance work inside the upper and lower doors 20 and 21.

The printed circuit board drilling machine according to the present embodiment is installed such that the distance from the floor on which the machine is placed to the upper surface of the table 22 is about 850 mm, and the horizontal distance from the front surface of the bed cover 17 to the spindle motor 27 is about 850 mm. By this arrangement, when the maintenance person average 1650 mm in height performs maintenance with respect to the spindle motor 27 and its peripheral parts, the maintenance person can easily reach the spindle motor 27 and its peripheral parts only by bending down to take forward tilting posture, thus the maintenance person can easily perform maintenance work.

Note that operations of placing the printed circuit boards on the table 22 and exchanging the printed circuit boards, other than general maintenance work can be easily made without opening the lower door 21.

In the printed circuit board drilling machine according to the above-described embodiment of the present invention, as the openable/closable door provided in the front portion is separated into upper and lower doors, and the upper door opens upward and the lower door opens downward, the upper door can be moved with a small amount of force. Thus, load on the operator can be reduced.

Further, as a junction portion between the upper door and the lower door is projected to a position in front of the front surface of the base portion of the lower portion of the machine, the operator can enter the inside of the door when the doors are opened. Further, as the distance from the operator to the spindle motor can be reduced, the maintenance work can be easily performed.

Further, as the upper door is formed with transparent material, the operation status of the machine can be easily monitored.

As described above, according to the present invention, a printed circuit board drilling machine, with a well-designed outer shape, providing excellent operability and maintainability can be provided.

As many apparently widely different embodiments of the present invention can be made without departing from the spirit and scope thereof, it is to be understood that the invention is not limited to the specific embodiments thereof except as defined in the appended claims.

What is claimed is:

1. A printed circuit board drilling machine which sequentially makes a number of holes in at least one printed circuit board, placed on a table moved in at least an X-direction, by using a drill driven by a spindle motor, wherein an openable/closable door is provided in a front portion, wherein said door being separated into an upper door and a lower door, and wherein said upper door opens upward, while said lower door opens downward.

2. The printed circuit board drilling machine according to claim 1, wherein a junction portion between said upper door and said lower door is projected to a position in front of a front surface of a base portion of said machine.

3. The printed circuit board drilling machine according to claim 1, wherein said lower door covers at least a guide device having a table driving mechanism below said table.

4. A maintenance method for a printed circuit board drilling machine which sequentially makes a number of holes in at least one printed circuit board, placed on a table moved in at least an X-direction, by using a drill driven by a spindle motor, comprising the steps of:

opening a door, separated into an upper door and a lower door, provided in a front portion of the machine such that said upper door opens upward and said lower door opens downward; and moving said table inwardly for maintenance with respect to inside of said drilling machine.

* * * * *